United States Patent
Barsun et al.

(10) Patent No.: US 7,866,959 B2
(45) Date of Patent: Jan. 11, 2011

(54) FAN CLUTCH FOR AN ELECTRONICS COOLING FAN

(75) Inventors: Stephan Karl Barsun, Sacramento, CA (US); Edward Anglada, Roseville, CA (US); James David Hensley, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1156 days.

(21) Appl. No.: 11/042,917

(22) Filed: Jan. 24, 2005

(65) Prior Publication Data
US 2006/0165538 A1    Jul. 27, 2006

(51) Int. Cl.
F04B 35/04    (2006.01)

(52) U.S. Cl. .................... 417/423.5; 417/426

(58) Field of Classification Search ............. 417/423.5, 417/426; 415/18
See application file for complete search history.

(56) References Cited

U.S. PATENT DOCUMENTS

| | | | |
|---|---|---|---|
| 1,583,621 A * | 5/1926 | Steinberg ..................... 60/597 |
| 2,947,497 A * | 8/1960 | Sznycer ..................... 244/17.11 |
| 4,018,406 A * | 4/1977 | Parsons ........................ 244/98 |
| 5,438,226 A * | 8/1995 | Kuchta ........................ 307/125 |
| 5,546,272 A * | 8/1996 | Moss et al. .................. 361/687 |
| 5,617,817 A | 4/1997 | Martin |
| 5,669,336 A | 9/1997 | Williams |
| 5,701,045 A | 12/1997 | Yokozawa et al. |
| 5,722,523 A | 3/1998 | Martin |
| 5,835,786 A | 11/1998 | Brown et al. |
| 5,848,678 A | 12/1998 | Johnston et al. |
| 5,879,141 A | 3/1999 | Yokozawa et al. |
| 5,896,964 A | 4/1999 | Johnston et al. |
| 5,896,965 A | 4/1999 | Gopalswamy et al. |
| 5,947,248 A | 9/1999 | Link |
| 6,101,459 A * | 8/2000 | Tavallaei et al. ............ 702/132 |
| 6,118,658 A | 9/2000 | Nakase |
| 6,129,193 A | 10/2000 | Link |
| 6,199,391 B1 | 3/2001 | Link et al. |
| 6,331,743 B1 * | 12/2001 | Link .......................... 310/103 |
| 6,362,960 B1 * | 3/2002 | Ducourt et al. ............. 361/695 |
| 6,445,148 B2 * | 9/2002 | Huang et al. ................. 318/34 |
| 6,626,653 B2 * | 9/2003 | Lin et al. .................. 417/423.5 |
| 6,634,476 B2 | 10/2003 | Inoue et al. |
| 6,648,065 B2 * | 11/2003 | Huang et al. ................ 165/121 |
| 6,732,845 B2 | 5/2004 | Tilly et al. |
| 2003/0192763 A1 | 10/2003 | Inoue et al. |
| 2004/0101404 A1 | 5/2004 | Takemoto |
| 2004/0118656 A1 | 6/2004 | Inoue et al. |
| 2007/0092370 A1 * | 4/2007 | Malone et al. .............. 415/123 |

FOREIGN PATENT DOCUMENTS

JP    06069673 A *    3/1994
JP    09 296 828        5/1998

* cited by examiner

*Primary Examiner*—Michael Cuff
*Assistant Examiner*—Vikansha S Dwivedi (57) ABSTRACT

An electronic system, an apparatus for cooling an electronic system, an electronics cooling apparatus, and associated method use a clutch to operate a cooling fan. An electronics cooling fan for usage in cooling an electronic system comprises a clutch that disengages upon failure wherein the electronics cooling fan is configured to freewheel upon disengagement of the clutch.

21 Claims, 5 Drawing Sheets

FAN CLUTCH FOR AN ELECTRONICS COOLING FAN

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

Fan failure and locked rotors resulting from bearing failure can adversely affect cooling by impeding airflow. In some circumstances insufficient heat transfer can take place and the equipment may overheat and potentially sustain thermal damage.

SUMMARY

In accordance with an embodiment of a cooling apparatus, an electronics cooling fan comprises a clutch adapted to disengage and freewheel upon bearing and/or motor failure.

BRIEF DESCRIPTION OF THE DRAWINGS

Embodiments of the invention relating to both structure and method of operation, may best be understood by referring to the following description and accompanying drawings whereby.

DETAILED DESCRIPTION

Figure 1A:
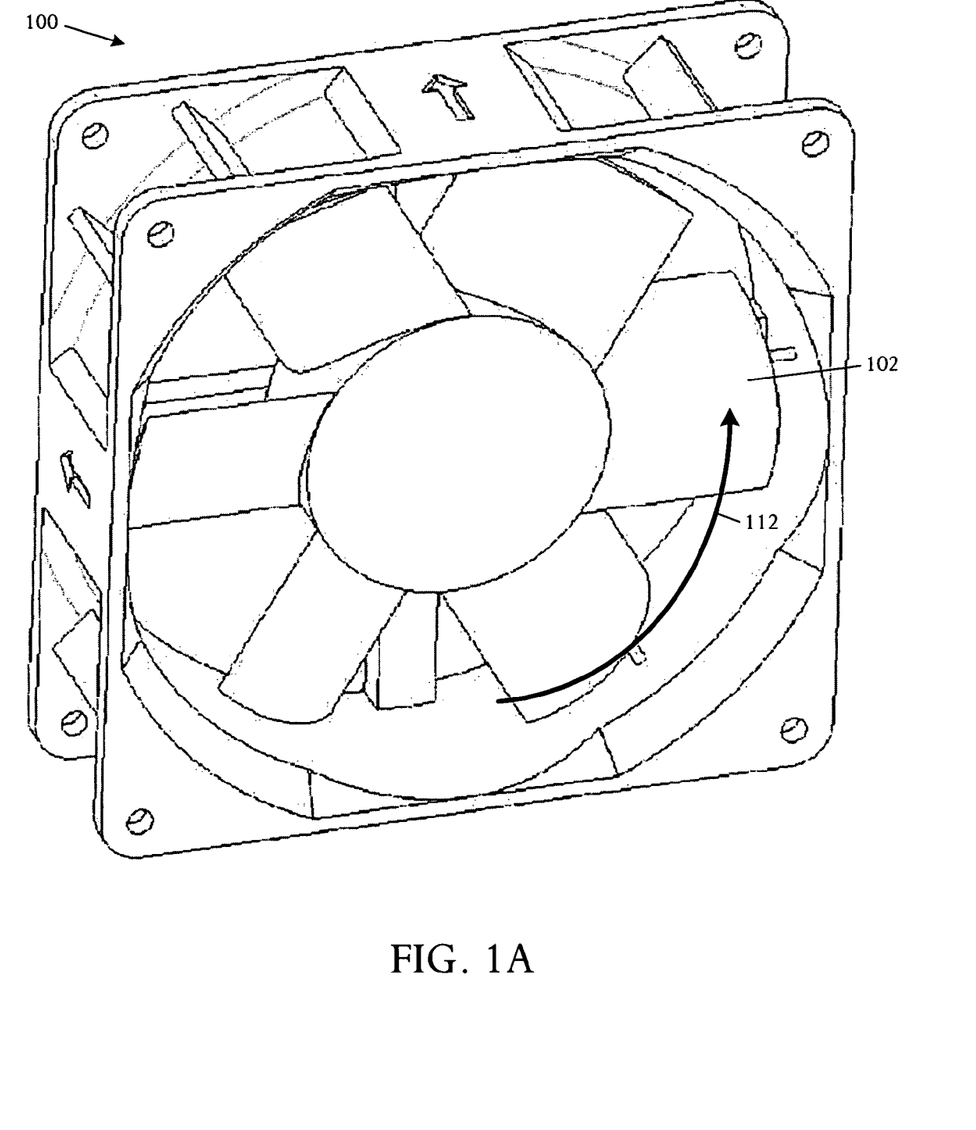
FIGS. 1A and 1B are a perspective pictorial isometric view and cross-sectional side view depicting an embodiment of a cooling apparatus including an electronics cooling fan with a clutch adapted to disengage and freewheel upon failure.
Figure 1B:
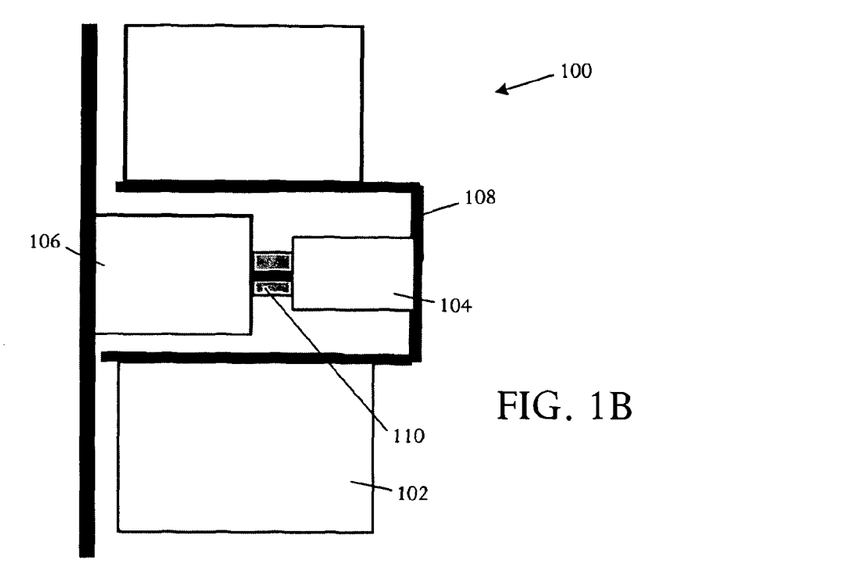

Referring to FIGS. 1A and 1B, a perspective pictorial isometric view and cross-sectional side view depict an embodiment of a cooling apparatus 100 which includes an electronics cooling fan 102 with a clutch 104 adapted to disengage and freewheel upon failure.

The clutch 104 positioned between a motor 106 and an electronics cooling fan 102 enables the fan to freewheel when the motor or main bearings 110 fail.

The clutch 104 is configured to operate automatically to engage and disengage the cooling fan 102 from a motor 106, generally in a failure condition. In various embodiments, the clutch 104 may be any suitable type of clutch for example a centrifugal clutch, a ratcheting clutch, a magnetic clutch, a magnetorheological clutch, an hydraulic clutch, a fluid friction clutch, and the like. The clutch 104 enables the motor 106 to drive the electronics cooling fan 102 but disengages to allow the fan 102 to continue rotating if the motor 106 or bearings 110 fail.

FIG. 1B illustrates the electronics cooling fan 102, showing a hub 108, a motor 106 housed in the hub 108, and the clutch 104 housed inside the hub 108. The clutch 104 is adapted to engage the electronics cooling fan 102 during normal rotational operation, driving air movement by the fan 102. The clutch 104 is further adapted to disengage upon failure of the motor 106 and/or bearings 110 in the fan 102.

In the illustrative embodiment, the motor 106 and clutch 104 are housed in the center hub 108 of the fan 102. During normal operation, the motor 106 spins in the indicated direction 112, engaging the clutch 104 and thereby driving the electronics cooling fan 102 to move air. If the fan motor 106 or bearings 110 fail, the clutch 104 disengages.

Figure 2:
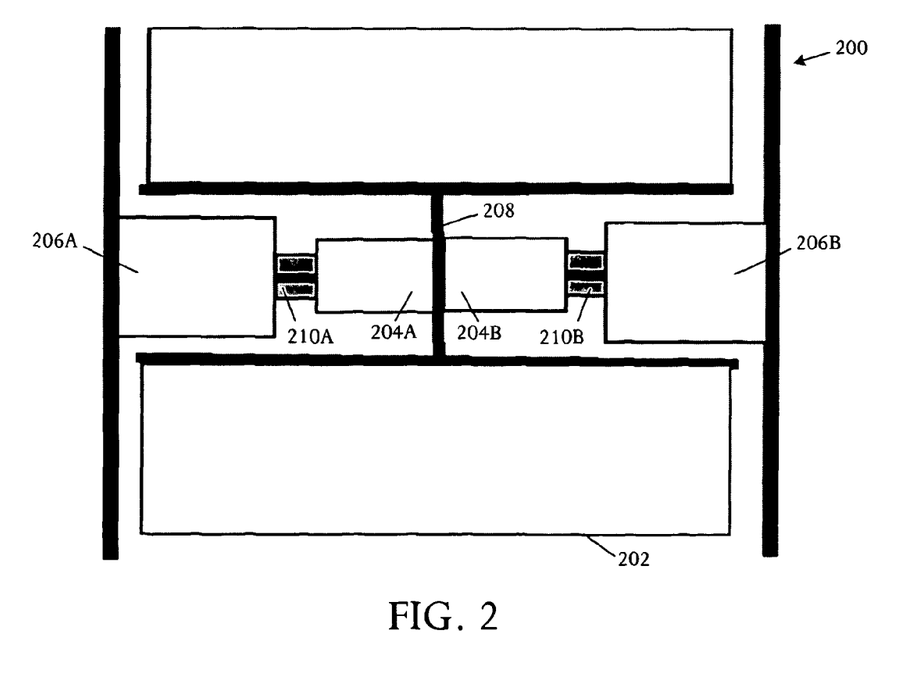
FIG. 2 is a cross-sectional pictorial diagram showing another embodiment of an electronics cooling fan further including a hub, multiple motors, and multiple clutches.

Referring to FIG. 2, a cross-sectional pictorial diagram shows another embodiment of an electronics cooling fan 200 further comprising a hub 208, a plurality of motors 206A, 206B housed in the hub 208, and a plurality of clutches 204A, 204B. The multiple clutches 204A and 204B are housed in the hub 208, respectively corresponding to the motors 206A, 206B. The multiple clutches 204A and 204B are adapted to engage the electronics cooling fan 200 during normal rotational operation, driving air movement by the fan 200. The multiple clutches 204A and 204B are also adapted to disengage upon failure of the respective motor 206A or 206B and/or associated bearings 210A or 210B.

In the redundant configuration shown in FIG. 2, the clutches 204A and 204B enable two motors 206A, 206B to drive a rotor. If one or the motors 206A 206B or respective associated bearings 210A or 210B fails, the clutches 204A and 204B operate in combination to drive the non-failing fan independently.

Figure 3:
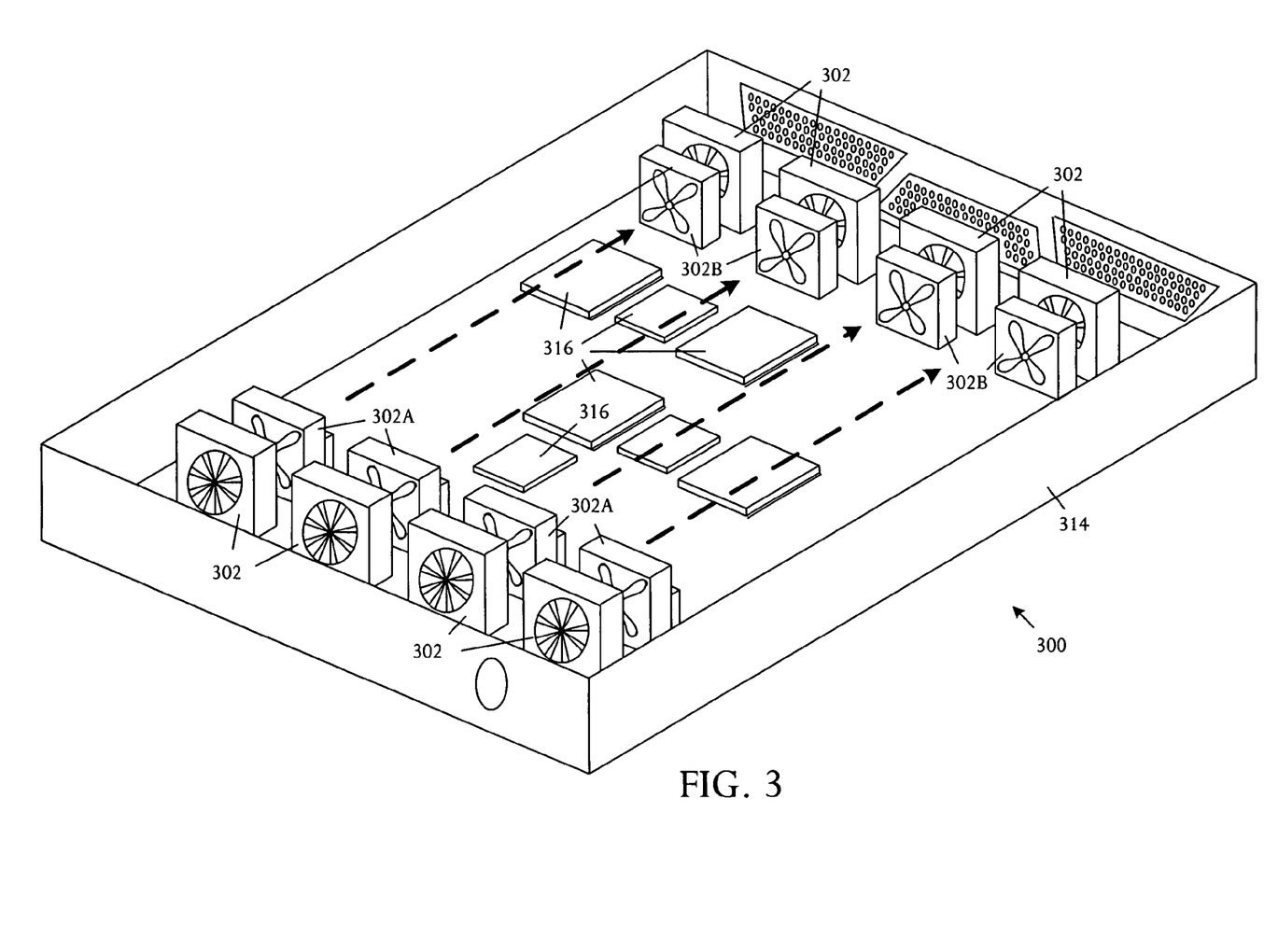
FIG. 3 is a perspective pictorial diagram showing an embodiment of an electronic system that may use the illustrative cooling fans.

Referring to FIG. 3, a perspective pictorial diagram shows an embodiment of an electronic system 300 comprising a chassis 314, one or more electronic components 316 contained by the chassis 314, and a plurality of electronics cooling fans 302 contained by the chassis 314. The multiple electronics cooling fans 302 include at least two electronics cooling fans, for example fans 302A and 302B connected in series. The series-connected electronics cooling fans 302A and 302B include a clutch, for example as shown in FIGS. 1A and 1B, which is adapted to disengage and freewheel upon failure.

In the failure condition, at least one non-failing fan of the series-connected electronics cooling fans 302A or 302B remains engaged and creates airflow that causes the disengaged fan to spin. Thus, a fan that is no longer operational due to failure of an attached motor or bearings is disengaged by the clutch and enabled to freewheel. The disengaged fan begins to spin as a result of the airflow generated by the other, non-failing fans which are connected in series, even though the motor coupled to the fan is not running or is frozen in place.

The illustrative electronics cooling fans and associated systems enable fan blades to rotate in the event of a motor or other failure, thereby reducing flow resistance. In contrast, failure of a fan motor or bearings in a conventional system results in a locked rotor fan. The locked rotor fan generally leads to a substantially increased flow resistance and therefore chassis temperature in comparison to the illustrative system that disengages the fan and enables freewheeling.

Electronics cooling fan embodiments employing the clutch enable sufficient system cooling without needing more powerful fans to overcome cooling performance degradation resulting from a failed fan. The illustrative embodiments also facilitate redundant N+1 cooling.

The electronics cooling fans that implement the illustrative clutches decrease flow resistance through a failed fan, enabling sufficient system cooling without adding more fans to appropriately cool components in a failed fan condition. The illustrative electronics cooling fans further enable smaller systems to be assembled, avoiding a necessity for larger fans while addressing failure due to a locked motor.

The illustrative electronic system 300 contains multiple electronics cooling fans including fans 302A, 302B. A rotor is coupled to a motor using a clutch to enable disengagement of a fan 302A or 302B from the motor in the event of a failure condition. The electronics cooling fans 302A, B are used by selectively positioning the fans 302A, B inside the chassis 314 in locations suitable for cooling the electronic components 316. In a typical useful arrangement, one or more cooling fans 302A, B are positioned in series inside the chassis 314. The electronic system 300 may include a control element such as a processor, central processing unit, computer, logic, or the like that engages the clutch, thereby coupling the rotor and the motor during operation and alternatively disengaging the clutch so that the rotor freewheels on electronics cooling fan failure.

Figures 4A, 4B:
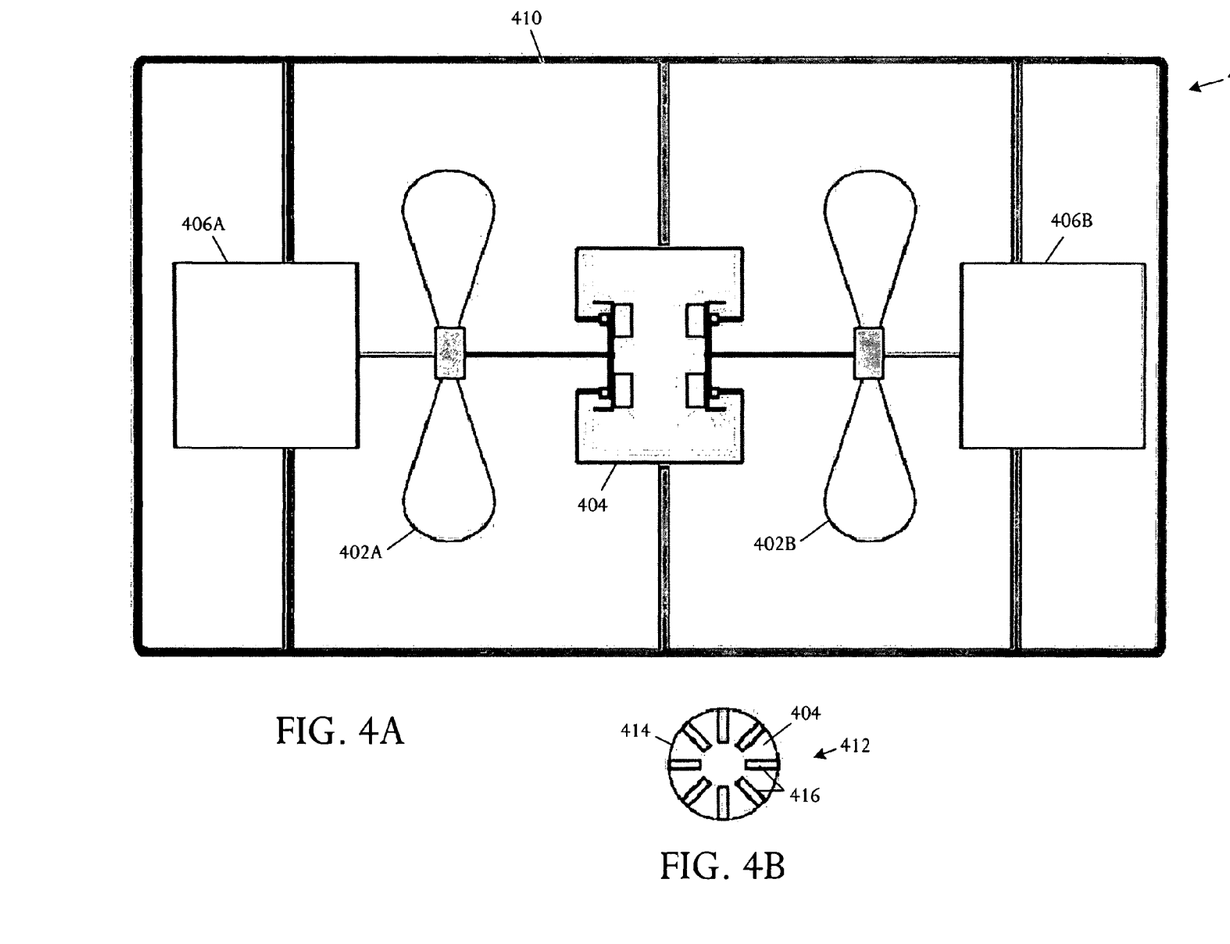
FIG. 4A is a schematic cross-sectional pictorial diagram illustrating an embodiment of an electronics cooling apparatus with multiple fans and a fan clutch.
FIG. 4B is a cross-sectional pictorial diagram illustrating an embodiment of the fluid clutch depicted in FIG. 4A.

Referring to FIG. 4A, a schematic cross-sectional pictorial diagram illustrates an embodiment of an electronics cooling apparatus 400 with multiple fans and a fan clutch. In the illustrative embodiment, the electronics cooling apparatus 400 comprises a housing or chassis 410, first and second cooling fans 402A, 402B contained within the chassis 410, first and second motors 406A, 406B respectively coupled to the first and second cooling fans 402A, 402B, and a clutch 404 coupling the first and second cooling fans 402A, 402B in series.

The fan clutch 404 operates to automatically engage or disengage a fan from a driving motor, typically to enable freewheeling and thereby reduce flow resistance that may otherwise occur due to locking resulting from motor or bearing failure.

The clutch 404 is adapted to engage the first and second cooling fans 402A, 402B in normal operation. In the event of failure of a motor 406A or 406B, the clutch 404 drives the cooling fan 402A or 402B coupled to the failing motor using the non-failing motor 406A or 406B. Thus, the clutch 404 enables mutually independent operation of the first and second cooling fans 402A, 402B when both motors 406A, 406B are functional while enabling a fan with a failing motor to remain operational. In an illustrative embodiment, the first and second cooling fans 402A, 402B are configured to spin in the same direction.

In the illustrative embodiment, the clutch 404 is shown as a fluid clutch, although in other embodiments other types of clutches can be used such as a centrifugal clutch, a ratcheting clutch, a magnetic clutch, a magnetorheological clutch, a hydraulic clutch, a fluid friction clutch and the like.

A centrifugal clutch is actuated by radial motion and typically has radially moveable centrifugal weights mounted on a drive. Centrifugal force causes the centrifugal weights to transmit a particular torque friction to the clutch. Upon reaching a radial velocity limit, an automatic coupling occurs, resulting in a load-free startup of the drive motor.

A ratcheting clutch is a common mechanism that includes a pawl for engaging sloping teeth of a wheel or bar, and permitting motion in only one direction.

A magnetic clutch generally includes a field/rotor assembly and a pulley/armature assembly. The field/rotor assembly includes a coil and backing plate. The coil generates magnetic flux that enables engagement and the pulling action of the clutch. The rotor generates input rotation and commonly rotates constantly. The pulley/armature assembly includes an armature disk, springs, hub, and pulley or mounting flange. The armature is engaged to the rotor by magnetic attraction. Magnetic flux is transferred into the rotor and then to the armature. Slots in the rotor and armature enable the magnetic flux to contact the rotor and the armature in multiple places. Multiple points of flux connection enable an increase in torque. The clutch can be disengaged by reducing or eliminating voltage applied to the coil. When the voltage is released, springs between the armature and the hub pull the armature away from the rotor, forming an air gap separating the armature and rotor. One aspect of the magnetic clutch is ease of control in an electrical system.

An example embodiment of a magnetorheological clutch uses a magnetorheological fluid containing a suspension of finely powdered iron or iron alloy in a fluid such as mineral oil or silicone. The clutch includes a rotatable input shaft, clutch plates arranged to form walls of a housing with interior cavity. Magnetorheological fluid is carried in the cavity and used to variably transfer torque between an input clutch plate and the housing. The clutch further includes a coil that carries a variable electrical current to create a variable magnetic field across an input clutch plate and through the magnetorheological fluid, supplying modulated torque transmission between the input clutch plate and the housing.

A liquid clutch, hydraulic clutch, or fluid friction clutch generally have a structure in which the driving torque of a driving disc is transmitted to a case by an oil or other liquid supplied to a torque transmission chamber.

The clutch 404 functions as a coupling mechanism that connects the two cooling fans 402A, 402B in series within a common housing 410. The clutch 404 is positioned between the two fans 402A, 402B enabling the fans to operate independently of one another. If and when either motor 406A, 406B fails, the coupling mechanism disengages the fan driven by the failed motor. The two cooling fans 402A, 402B rotate in the same direction so that the airflow from the operating fan creates an air flow that spins the failed fan to prevent or alleviate reduction in airflow. Thus, the clutch 404 functions as a coupling mechanism that increases performance in response to a failure event. In a redundant fan configuration, the coupling mechanism operates to increase performance in the case of a failure associated with a fan system that results in a drop from cooling using N+1 cooling units to cooling which has N cooling units, where N designates the specified number of cooling units sufficient to cool a particular system.

Arrangement of two fans in series is a typical technique for attaining N+1 cooling, whereby a loss of one fan to leave N operating fans maintains system cooling without deleterious thermal effects. A difficulty with conventional N+1 cooling systems is that failure of one fan tends to result in airflow capability which is less than the airflow attained using N fans because the failed fan inserts airflow resistance, thereby degrading overall airflow. A motor and/or bearing failure that locks a fan in place accentuates the increase in airflow resistance. Usually the increased airflow resistance is compensated by over-design efforts, such as adding more fans or increasing the power of the fans, techniques that substantially increase system cost.

The illustrative electronics cooling apparatus 400 decreases or eliminates the cooling degradation resulting from fan failure. The illustrative electronics cooling apparatus 400 also enables usage of smaller cooling systems, and thus smaller electronics systems, since usage of the larger motors and/or fans sufficiently powerful to overcome a locked rotor can be avoided.

In some embodiments, the clutch 404 may be configured to enable a cooling fan 402A or 402B to freewheel in response to a locking failure of the motor 406A or 406B, respectively, which is directly coupled to the cooling fan. A locking failure is a failure that causes the affected motor to lock into place.

In some configurations, failure of a motor in an illustrative dual fan system 400 can slow the operating motor 406A or 406B due to drag forces created by the freewheeling fan, despite inclusion of the clutch 404 enabling the electronics cooling fan 400 to freewheel. However in the illustrative conditions, the single motor turning two rotors through operation of the clutch 404 as a coupling mechanism generally has similar or superior airflow capability in comparison to a single motor turning a single rotor.

FIG. 4B is a cross-sectional pictorial diagram illustrating an embodiment of the fan clutch 404 in the form of a fluid-coupled propeller 412. A fluid with a viscosity selected according to desired coupling effectiveness is enclosed within a container 414 with vanes 416 extending into the fluid and coupled with the fan rotor.

Figure 5:
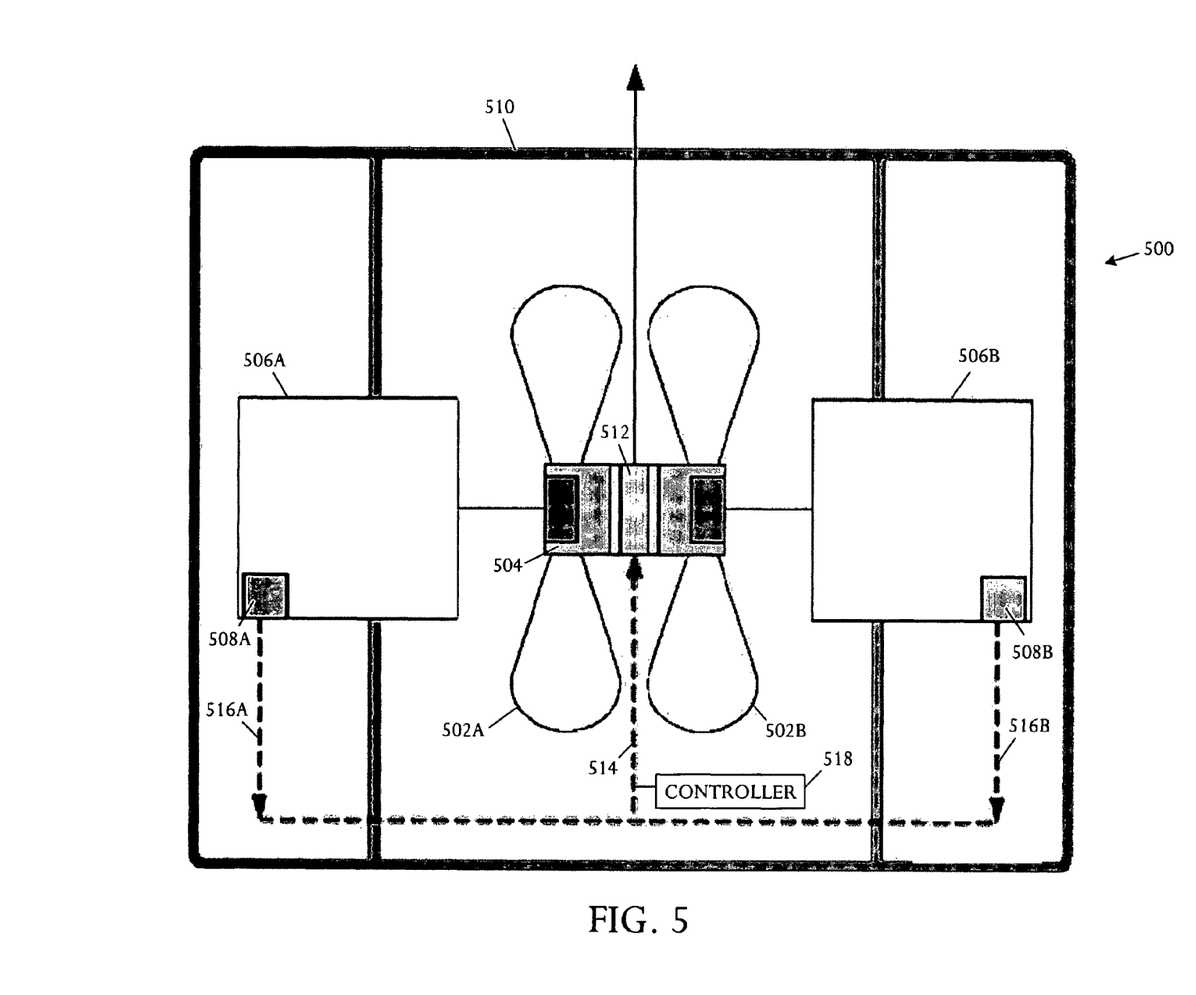
FIG. 5 is a schematic cross-sectional pictorial diagram illustrating an embodiment of a dual clutch coupled fan.

Referring to FIG. 5, a schematic cross-sectional pictorial diagram illustrates an embodiment of an electronics cooling apparatus 500 in the form of a dual clutch coupled fan. The illustrative embodiment includes control components or elements that enable automatic control of coupled electronic cooling fans. The electronics cooling apparatus 500 includes a coupler, depicted in the form of a fan clutch 504 that connects multiple cooling fans 502A, 502B in a chassis or housing 510. The coupler is illustratively in the form of a fan clutch 504, for example a magnetic clutch, between the two fans 502A, 502B, enabling both fans 502A, 502B to operate independently of one another. When a motor 506A or 506B connected to either respective fan 502A or 502B fails, the failing motor terminates operation and enables the fan to freewheel. At about the same time, a signal can be sent to an electronic actuator 512 to activate a magnetic coupling mechanism 504, illustratively a magnetic fan clutch, and can generate a signal informing various components and devices in the electronics cooling apparatus 500 of the error condition. The cooling fan coupled to the failing motor can be disengaged by the clutch 504. The disengaged cooling fan spins as a consequence of the airflow created by the fan connected to the non-failing motor. The non-failing motor can be controlled to respond to the failure condition by increasing the airflow drive capability, for example by rotating the non-failing motor at a higher angular rate. In a particular example, the non-failing motor can be operated at a high speed, or the maximum speed, increasing the system airflow to rates typical for non-failing conditions.

The electronics cooling apparatus 500 has a chassis or housing 510 containing first and second cooling fans 502A, 502B and motors 506A, 506B respectively coupling to the fans. A clutch 504 couples the cooling fans 502A, 502B in series. First and second sensors 508A, 508B respectively couple to the first and second motors 506A, 506B and are adapted to sense operational status of the connected motors 506A, 506B. An actuator 512 is coupled to the clutch and is adapted to selectively operate the clutch 504 to activate and deactivate the cooling fans 502A, 502B based on signals from the sensors 508A, 508B. For example, control lines 514 may connect the sensors 508A, 508B to the actuator 512 and carry communication signals indicative of motor status.

In a typical embodiment, the sensors 508A, 508B can be locked-rotor sensors, and the fans locked-rotor freewheel fans. A locked-rotor sensor is a common control component used to protect motors from overload conditions. The sensor trips when an electrical threshold, such as a resistance threshold, is exceeded. A typical locked-rotor sensor includes a current transformer, a transducer, and interface.

In an illustrative embodiment, the clutch 504 may be a magnetic clutch that is adapted to have engagement and disengagement controlled by the actuator 512. Implementation of a magnetic fan clutch 504 is useful in the depicted embodiment since the magnetic fan clutch 504 facilitates control via the actuator 512. However, in various embodiments, other types of fan clutches may be used that also have control capability.

If a motor 506A or 506B fails, the sensor 508A or 508B coupled to the failed motor senses the failure status and sends a signal to the actuator 512, which disengages the cooling fan 502A or 502B coupled to the failed motor. The disengaged cooling fan then can freewheel. The electronics cooling apparatus 500 may further include a communication link 516A from the first sensor 508A to the second motor 506B. The second motor 506B may be controlled to adjust second cooling fan speed in response to a signal from a failed motor signal from the first sensor 508A. Similarly, a communication link 516B from the second sensor 508B to the first motor 506A can adjust first cooling fan speed in response to a signal from a failed motor signal from the second sensor 508B.

The electronics cooling apparatus 500 may include a controller 518 with communication connections to the motors 506A, 506B, the sensors 508A, 508B, and the actuator 512. The controller 518 can receive a failure signal from a sensor indicative of a failing motor and respond with a signal to the actuator 512 requesting disengagement of the cooling fan coupled to the failing motor.

In some embodiments, the controller 518 may be programmed to receive a failure signal from a signaling sensor indicating failure of a motor and respond by sensing a command to the non-failing motor to increase the rotation speed of the cooling fan coupled to the non-failing motor.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. For example, although particular types of fan clutches are illustrated and described, any suitable fan clutch may be used. Similarly, various simple multiple-fan arrangements are shown to facilitate expression of the structures and techniques. Any suitable number and arrangement of fans, motors, clutches, and the like may be used and remain within the scope of the description.

In the claims, unless otherwise indicated the article "a" is to refer to "one or more than one".

What is claimed is:

1. An apparatus comprising:
    an electronics cooling fan assembly comprising a plurality of fans, a plurality of motors and associated bearings, each motor driving one of said fans, and a clutch assembly that disengages one of said fans upon failure of that fan's motor or bearings;
    wherein the fan corresponding to the failed motor or bearings is configured to freewheel upon disengagement by the clutch assembly while the another fan continues to be actively driven by its corresponding motor.

2. The apparatus according to claim 1 wherein:
the clutch assembly is selected from a group consisting of a centrifugal clutch, a ratcheting clutch, a magnetic clutch, a magnetorheological clutch, a hydraulic clutch, and a fluid friction clutch.

3. The apparatus according to claim 1 wherein the electronics cooling fan further comprises:
a hub;
wherein the motors and clutch assembly are housed in the hub.

4. The apparatus according to claim 1 wherein the electronics cooling fan further comprises:
a hub; and
wherein the clutch assembly comprises a plurality of clutches housed in the hub and respectively corresponding to each of the motors, clutch configured to engage a fan during normal rotational operation, driving air movement by the fan, and configured to disengage such fan upon failure of the respective motor and/or bearings.

5. An electronic system comprising:
a chassis;
at least one electronic component contained by the chassis; and
a plurality of electronics cooling fans contained by the chassis, the plurality of electronics cooling fans including at least two electronics cooling fans connected in series, the series-connected electronics cooling fans comprising a clutch that disengages upon failure wherein one of the series-connected electronics cooling fans is configured to freewheel upon disengagement of the clutch.

6. The electronic system according to claim 5 wherein:
at least one non-failing electronics cooling fan in the series-connected electronics cooling fans remains engaged and creates airflow driving fan spinning of a freewheeling disengaged electronics cooling fan that has failed.

7. The electronic system according to claim 5 wherein ones of the series-connected electronics cooling fans further comprise:
a hub;
a motor housed in the hub; and
the clutch housed in the hub that engages during normal rotational operation, driving air movement by the electronics cooling fan, and disengages upon failure of the motor and/or bearings.

8. A method of cooling an electronic system comprising:
coupling a clutch assembly between a rotor of each of a pair of fans and a corresponding pair of motors;
engaging the clutch assembly coupling the rotors and the motors during operation;
detecting a failure of one of the motors; and
causing the clutch assembly to disengage, from the failed motor, the rotor of the fan corresponding to the failed motor wherein the disengaged rotor freewheels while the rotor of the other fan continues to be driven by its corresponding motor.

9. The method according to claim 8 further comprising:
providing a chassis adapted to contain at least one electronic component; and
positioning at least two electronics cooling fans in series in the chassis.

10. An electronics cooling apparatus comprising:
a chassis;
first and second cooling fans contained within the chassis;
first and second motors respectively coupled to the first and second cooling fans; and
a clutch coupling the first and second cooling fans in series that disengages upon failure of one of the first and second motors and is configured to freewheel a respective one of the first and second cooling fans on clutch disengagement.

11. The apparatus according to claim 10 wherein:
the clutch engages the first and second cooling fans in normal operation and, upon failure of a motor of a respectively-coupled cooling fan and motor, drives the cooling fan coupled to the failed motor using the non-failing motor.

12. The apparatus according to claim 10 wherein:
the clutch operates the first and second cooling fans mutually independently.

13. The apparatus according to claim 10 wherein:
the first and second cooling fans are configured to spin in the same direction.

14. The apparatus according to claim 10 wherein:
the clutch is selected from a group consisting of a centrifugal clutch, a ratcheting clutch, a magnetic clutch, a magnetorheological clutch, a hydraulic clutch, and a fluid friction clutch.

15. The apparatus according to claim 10 wherein:
the clutch disengages in response to a locking failure of the motor directly coupled to a cooling fan wherein the cooling fan freewheels.

16. The apparatus according to claim 10 further comprising:
first and second sensors respectively coupled to the first and second motors that sense operational status of the respective first and second motors; and
an actuator coupled to the clutch configured to controllably activate and deactivate the clutch, the actuator being communicatively coupled to the first and second sensors and controlled by signals from the first and second sensors.

17. The apparatus according to claim 16 wherein:
in event of a failed motor of the first and second motors, the respective sensor coupled to the failed motor senses the failure status and sends a signal to the actuator, and the actuator disengages the cooling fan coupled to the failed motor, enabling freewheeling.

18. The apparatus according to claim 17 further comprising:
a communication link from the first sensor to the second motor, the second motor configured to adjust second cooling fan speed in response to a signal from a failed motor signal from the first sensor; and
a communication link from the second sensor to the first motor, the first motor configured to adjust first cooling fan speed in response to a signal from a failed motor signal from the second sensor.

19. The apparatus according to claim 16 further comprising:
a controller coupled to the first and second motors, the first and second sensors, and the actuator, the controller configured to receive a failure signal from a signaling sensor of the first and second sensors indicative of a respective failing motor of the first and second motors, and send a response signal to the actuator to disengage the cooling fan coupled to the failing motor.

20. The apparatus according to claim 16 further comprising:
a controller coupled to the first and second motors, the first and second sensors, and the actuator, the controller configured to receive a failure signal from a signaling sensor of the first and second sensors indicative of a respective failing motor of the first and second motors, and send a response signal to a non-failing motor of the first and second motors to increase rotation speed of the cooling fan coupled to the non-failing motor.

21. The apparatus according to claim 16 wherein:

the clutch is a magnetic clutch that has engagement and disengagement controlled by the actuator.

* * * * *

UNITED STATES PATENT AND TRADEMARK OFFICE
CERTIFICATE OF CORRECTION

| | | |
|---|---|---|
| PATENT NO. | : 7,866,959 B2 | Page 1 of 1 |
| APPLICATION NO. | : 11/042917 | |
| DATED | : January 11, 2011 | |
| INVENTOR(S) | : Stephan Karl Barsun et al. | |

It is certified that error appears in the above-identified patent and that said Letters Patent is hereby corrected as shown below:

In column 7, line 18, in Claim 4, before "clutch" insert -- each --.

Signed and Sealed this
Thirtieth Day of August, 2011

David J. Kappos
*Director of the United States Patent and Trademark Office*